(12) United States Patent
Omote et al.

(10) Patent No.: US 8,098,786 B2
(45) Date of Patent: Jan. 17, 2012

(54) RECEPTION APPARATUS

(75) Inventors: Kazuyuki Omote, Chuo-ku (JP); Ryutaro Saito, Chuo-ku (JP)

(73) Assignee: Thine Electronics, Inc., Tokyo (JP)

( * ) Notice: Subject to any disclaimer, the term of this patent is extended or adjusted under 35 U.S.C. 154(b) by 290 days.

(21) Appl. No.: 12/594,915

(22) PCT Filed: Feb. 8, 2008

(86) PCT No.: PCT/JP2008/052156
§ 371 (c)(1),
(2), (4) Date: Oct. 6, 2009

(87) PCT Pub. No.: WO2008/126463
PCT Pub. Date: Oct. 23, 2008

(65) Prior Publication Data
US 2010/0119023 A1    May 13, 2010

(30) Foreign Application Priority Data
Apr. 11, 2007  (JP) ................. 2007-104050

(51) Int. Cl.
*H04L 7/00* (2006.01)
(52) U.S. Cl. ........ 375/355; 375/373; 375/375; 375/376; 327/144; 327/146; 327/147; 327/149; 327/150
(58) Field of Classification Search .................. 375/355, 375/373, 375, 376; 327/144, 146, 147, 149, 327/150
See application file for complete search history.

(56) References Cited

U.S. PATENT DOCUMENTS

| | | | |
|---|---|---|---|
| 6,864,734 B2 * | 3/2005 | Okamura | 327/291 |
| 7,512,201 B2 * | 3/2009 | Kelly et al. | 375/356 |
| 2002/0196883 A1 * | 12/2002 | Best et al. | 375/355 |
| 2003/0043926 A1 * | 3/2003 | Terashima et al. | 375/257 |
| 2003/0053577 A1 | 3/2003 | Watarai | |
| 2003/0085744 A1 | 5/2003 | Heo et al. | |
| 2006/0120496 A1 | 6/2006 | Okamura | |
| 2008/0152057 A1 * | 6/2008 | Lee et al. | 375/355 |

FOREIGN PATENT DOCUMENTS

| | | |
|---|---|---|
| JP | 11-275066 A | 10/1999 |
| JP | 2003-087114 A | 3/2003 |
| JP | 2003-203481 A | 7/2003 |
| JP | 2004-153712 A | 5/2004 |
| JP | 2005-006123 A | 1/2005 |
| JP | 2005-328109 A | 11/2005 |
| JP | 2006-101091 A | 4/2006 |

* cited by examiner

*Primary Examiner* — Phuong Phu
(74) *Attorney, Agent, or Firm* — Sughrue Mion, PLLC

(57) ABSTRACT

In a reception apparatus 1, a multiphase sampling clock signal is generated by a sampling clock signal generation circuit 40, based on a clock signal which has been phase-adjusted by a phase adjustment circuit 50. The data of each of the bits of a serial data signal is sampled and output by a sampler block circuit 30n, with timing indicated by the sampling clock signal. The amount of phase adjustment of the clock signal in the phase adjustment circuit 50 is set such that the delay time from generation of the multiphase sampling clock signal in the sampling clock signal generation circuit 40 until indication of the sampling timing by the sampling clock signal in the sampler block circuit 30n is canceled.

2 Claims, 11 Drawing Sheets

Fig.2

| Symbol | Min. | Typ. | Max. | Unit |
|---|---|---|---|---|
| tRIP1 | -skew | 0 | +skew | ns |
| tRIP0 | T/7 - skew | T/7 | T/7 + skew | ns |
| tRIP6 | 2*T/7 - skew | 2*T/7 | 2*T/7 + skew | ns |
| tRIP5 | 3*T/7 - skew | 3*T/7 | 3*T/7 + skew | ns |
| tRIP4 | 4*T/7 - skew | 4*T/7 | 4*T/7 + skew | ns |
| tRIP3 | 5*T/7 - skew | 5*T/7 | 5*T/7 + skew | ns |
| tRIP2 | 6*T/7 - skew | 6*T/7 | 6*T/7 + skew | ns |

RECEPTION APPARATUS

TECHNICAL FIELD

This invention relates to a reception apparatus which receives serial data signals and clock signals.

BACKGROUND ART

An LVDS reception apparatus is one example of a reception apparatus which receives serial data signals and clock signals. LVDS (Low Voltage Differential Signaling) is a method of transmitting and receiving signals by changing the current direction in a pair of resistor-terminated differential transmission lines, and is standardized as IEEE P1596.3. An LVDS reception apparatus receives serial data signals and clock signals from a plurality of channels transmitted over a pair of differential transmission lines, and based on the received clock signals, generates a sampling clock signal, and in sampler block circuits provided individually corresponding to each of the plurality of channels, samples and outputs each of the bits of data of the serial data signals based on the sampling clock signal.

In a reception apparatus which receives such serial data signals and clock signals, from generation of a sampling clock signal based on a received clock signal, until an indication of sampling timing by a sampling clock signal in a sampler block circuit, there exists a certain delay time due to the existence of an intermediate buffer. Due to the existence of this delay time, there is the possibility that in the sampler block circuit, the sampling timing indicated by a sampling clock signal may be positioned at a timing which is shifted from the center of the data window for each bit of the serial data signal.

An invention intended to resolve this problem is disclosed in Patent Reference 1. The invention disclosed in this reference document, while not explicitly stating that the invention is for LVDS, provides a delay circuit which imparts a delay to received serial data signals in a stage before the sampler block circuit. By making the delay amount of this delay circuit a prescribed value, the sampling timing indicated by a sampling clock signal in the sampler block circuit can be positioned at the center of the data window of each bit of the serial data signal.

Patent Reference 1: Japanese Patent Application Laid-open No. H11-275066

DISCLOSURE OF THE INVENTION

Problems to be Solved by the Invention

However, in the invention disclosed in the above Patent Reference 1, a delay is imparted to serial data signals by the delay circuit provided in a stage before the sampler block circuit, and so the following problems exist.

The level of serial data signals can change frequently compared with clock signals. It is undesirable for a delay signal which imparts a delay to serial data signals which undergo such rapid level changes to have a circuit configuration such that the transition time (rise time/fall time) required for serial data signal level changes is long. Hence this delay circuit must have a multistage delay gate circuit configuration, and moreover it is preferable that the number of gate stages be large. And, as the number of gate stages increases, variation in the delay time for the entire delay circuit comprising numerous delay gates becomes large.

For this reason, compared with the operating margin for skew between the serial data signal and the clock signal during reception, the operating margin between the serial data signal and the sampling clock signal in the sampler block circuit is small. Hence it is difficult to receive high-speed serial data signals.

This invention was devised in order to resolve the above problem, and has as an object the provision of a reception apparatus which can secure an operating margin between serial data signals and sampling clock signals in the sampler block circuit.

Means for Solving the Problem

A reception apparatus of this invention receives a serial data signal and a clock signal, and samples and outputs data of each bit of the serial data signal based on the clock signal, and is characterized in comprising (1) a sampler block circuit, which takes as input the received serial data signal, also takes as input a multiphase sampling clock signal, and samples and outputs the data of each bit of the serial data signal with timing indicated by the sampling clock signal; (2) a phase adjustment circuit, which takes as input the received clock signal, adjusts the phase of the input clock signal, and outputs a clock signal after this phase adjustment; and (3) a sampling clock signal generation circuit, which takes as input the clock signal phase-adjusted and output by the phase adjustment circuit, and generates the multiphase sampling clock signal based on the input clock signal.

Further, the phase adjustment circuit is characterized in that the phase of the clock signal is adjusted such that the delay time from generation of the multiphase sampling clock signal in the sampling clock signal generation circuit until indication of sampling timing by the sampling clock signal in the sampler block circuit is canceled.

In this reception apparatus, a received clock signal is phase-adjusted by a phase adjustment circuit. This phase-adjusted clock signal is input to a sampling clock signal generation circuit, and in the sampling clock signal generation circuit, a multiphase sampling clock signal is generated based on the input clock signal. The multiphase sampling clock signal generated by the sampling clock signal generation circuit is input to a sampler block circuit, and received serial data signals are also input to the sampler block circuit. In the sampler block circuit, the data of each of the bits of the serial data signal is sampled and output with timing indicated by the sampling clock signal.

Here, the clock signal phase adjustment amount in the phase adjustment circuit is set so as to cancel the delay time from generation of the multiphase sampling clock signal in the sampling clock signal generation circuit, until the sampling clock signal indicates the sampling timing in the sampler block circuit. Hence an operating margin is secured between the serial data signal and the sampling clock signal in the sampler block circuit.

Further, in a reception apparatus of this invention, it is preferred that the phase adjustment circuit comprise (a) a first delay portion, which imparts a delay to an input clock signal and outputs the clock signal, and in which the delay amount is variable; (b) a second delay portion, which imparts a delay of a prescribed amount to the clock signal output from the first delay portion, and outputs the clock signal; and (c) a delay control portion, which takes as input the clock signal input to the first delay portion, and takes as input the clock signal output from the second delay portion, and controls the delay amount in the first delay portion such that the phases of the two input clock signals coincide.

In this case, the clock signal input to the phase adjustment circuit is delayed by the first delay portion, the delay amount of which is variable, and is then output from the phase adjustment circuit and input to the sampling clock signal generation circuit. The clock signal output from the first delay portion is delayed by a prescribed amount by the second delay portion and is output. And, by means of the delay control portion, the delay amount in the first delay portion is controlled such that the phase of the clock signal input to the first delay portion and the phase of the clock signal output from the second delay portion coincide. By performing this control, the clock signal output from the phase adjustment circuit and input to the sampling clock signal generation circuit has a phase which leads that of the clock signal input to the phase adjustment circuit by the delay time in the second delay portion. The delay time in the second delay portion is set such that the delay time from generation of the multiphase sampling clock signal in the sampling clock signal generation circuit, to sampling timing indication by the sampling clock signal in the sampler block circuit, is canceled.

It is preferable that the first delay portion, with a variable delay amount, be a VCDL (Voltage Controlled Delay Line), comprising a plurality of VCD cells, each with a variable delay amount and cascade-connected. When there is the possibility that the period of the received clock signal may change, it is preferable that the phase adjustment amount in the phase adjustment circuit be variable as described above. On the other hand, when the received clock signal has a fixed period, the phase adjustment amount in the phase adjustment circuit may be fixed. The received serial data signal may be a differential signal, and may be in a plurality of channels. This invention can also be applied to LVDS reception apparatuses.

EFFECTS OF THE INVENTION

A reception apparatus of this invention can secure an operating margin between the serial data signal and the sampling clock signal in the sampler block circuit.

BRIEF DESCRIPTION OF THE DRAWINGS

FIG. 2 is a table summarizing the time difference between transition timing between bits in a serial data signal and the timing of the rise of a clock signal in LVDS reception.

EXPLANATION OF REFERENCE NUMERALS

Figure 1:
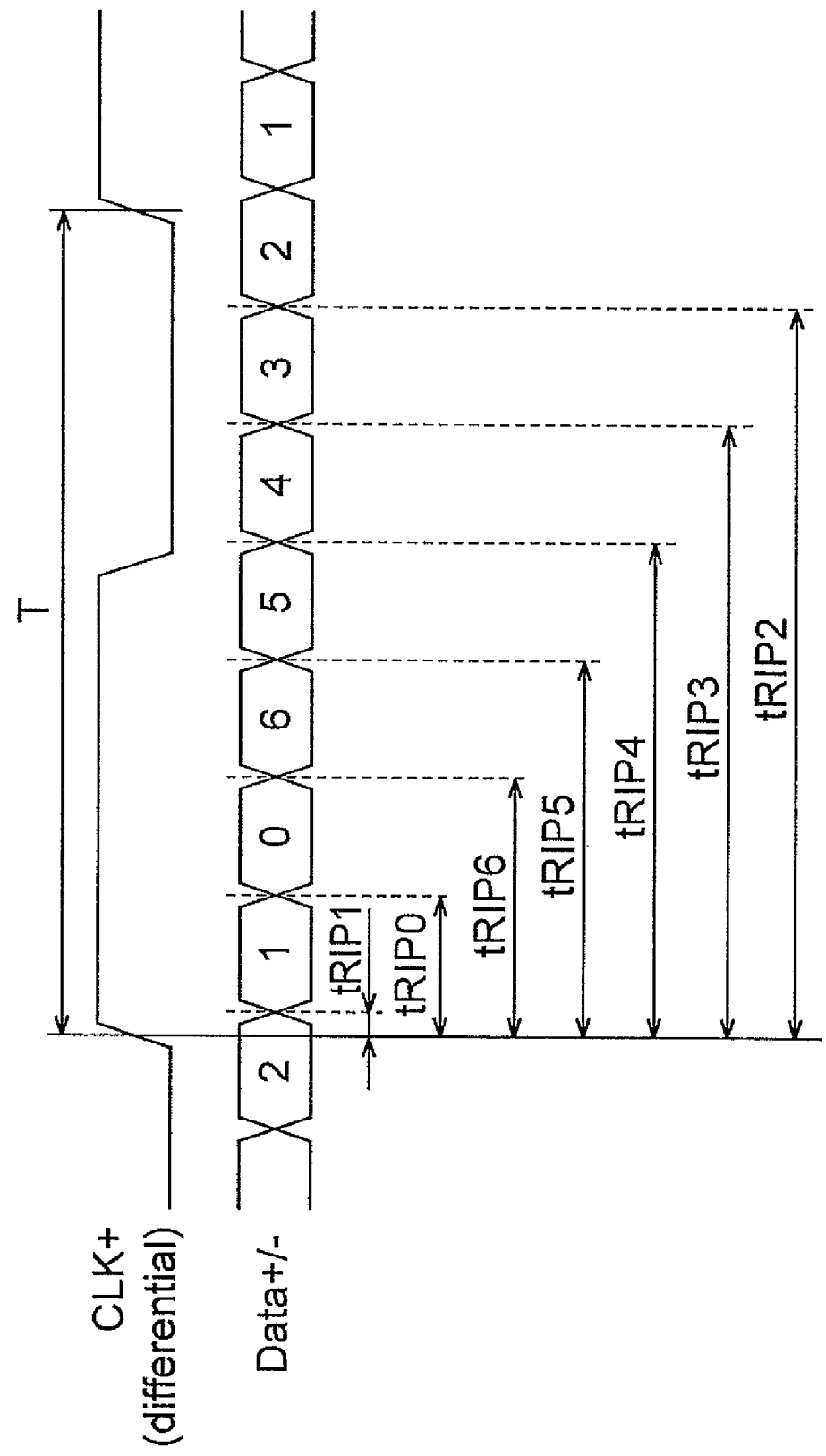
FIG. 1 shows the timing of a serial data signal and a clock signal in LVDS reception.

1 Reception apparatus
10 Reception buffer portion
$30_0$ to $30_N$ Sampler block circuit
31 Sampler portion
32 Input buffer portion
40 Sampling clock signal generation circuit
41 VCDL portion
42 Output buffer portion
43 Delay control portion
50 Phase adjustment circuit
51 VCDL portion
52 Delay portion
53 Delay control portion

BEST MODE FOR CARRYING OUT THE INVENTION

Below, preferred aspects to implement the invention are explained in detail, referring to the attached drawings. In explanations of the drawings, the same symbols are assigned to the same elements, and redundant explanations are omitted. Further, in the following an LVDS reception apparatus which receives 7-bit serial data signals in each of a plurality of channels is explained; however, the invention is not limited to such a device. Also, in the following, after first explaining the timing specifications related to reception in an LVDS system, a reception apparatus of a comparison example which is contrasted with the reception apparatus of a present embodiment of the invention is explained, and then the reception apparatus of the present embodiment is explained.

First, FIG. 1 and FIG. 2 are used to explain timing specifications related to reception in an LVDS system. FIG. 1 shows the timing of a serial data signal and a clock signal in LVDS reception. And, FIG. 2 is a table summarizing the time difference between transition timing between bits in a serial data signal and the timing of the rise of a clock signal in LVDS reception.

As typical (Typ.) values in timing specifications for LVDS reception, relative to the rise of the clock signal (CLK+), the data (Data+/−) of the serial data signal transitions from bit 2 to bit 1, and then, with a time interval of T/7, from bit 1 to bits 0, 6, 5, 4, 3. Here T is the clock signal period. In this way, serial data signals can change level with higher frequency than the clock signal. Also, in a reception apparatus a ±skew shift relative to the typical values of the above timing specifications is allowed. This skew is set to an appropriate value according to the system.

Figure 3:
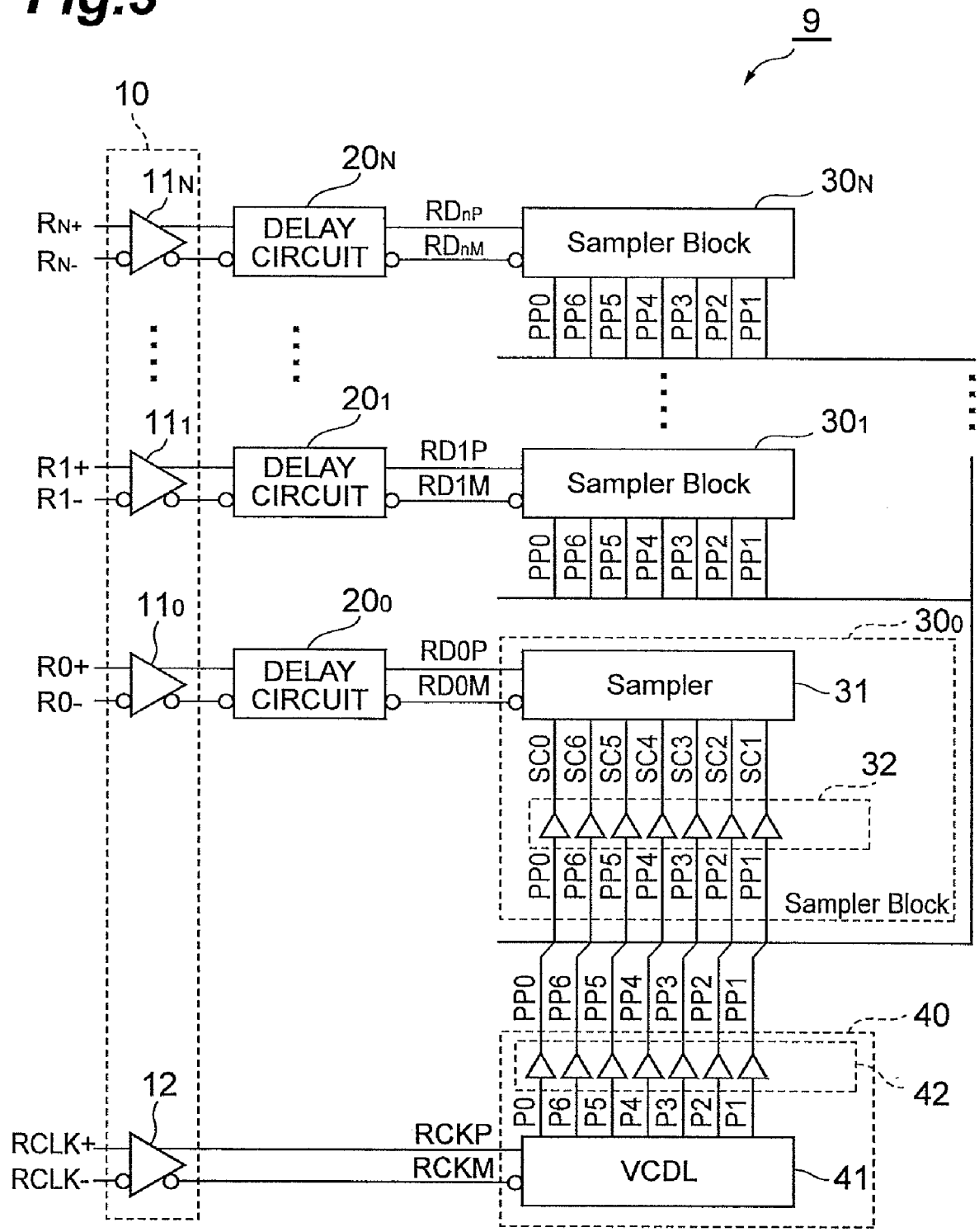
FIG. 3 shows the overall configuration of the reception apparatus 9 of a comparison example.
Figure 4:
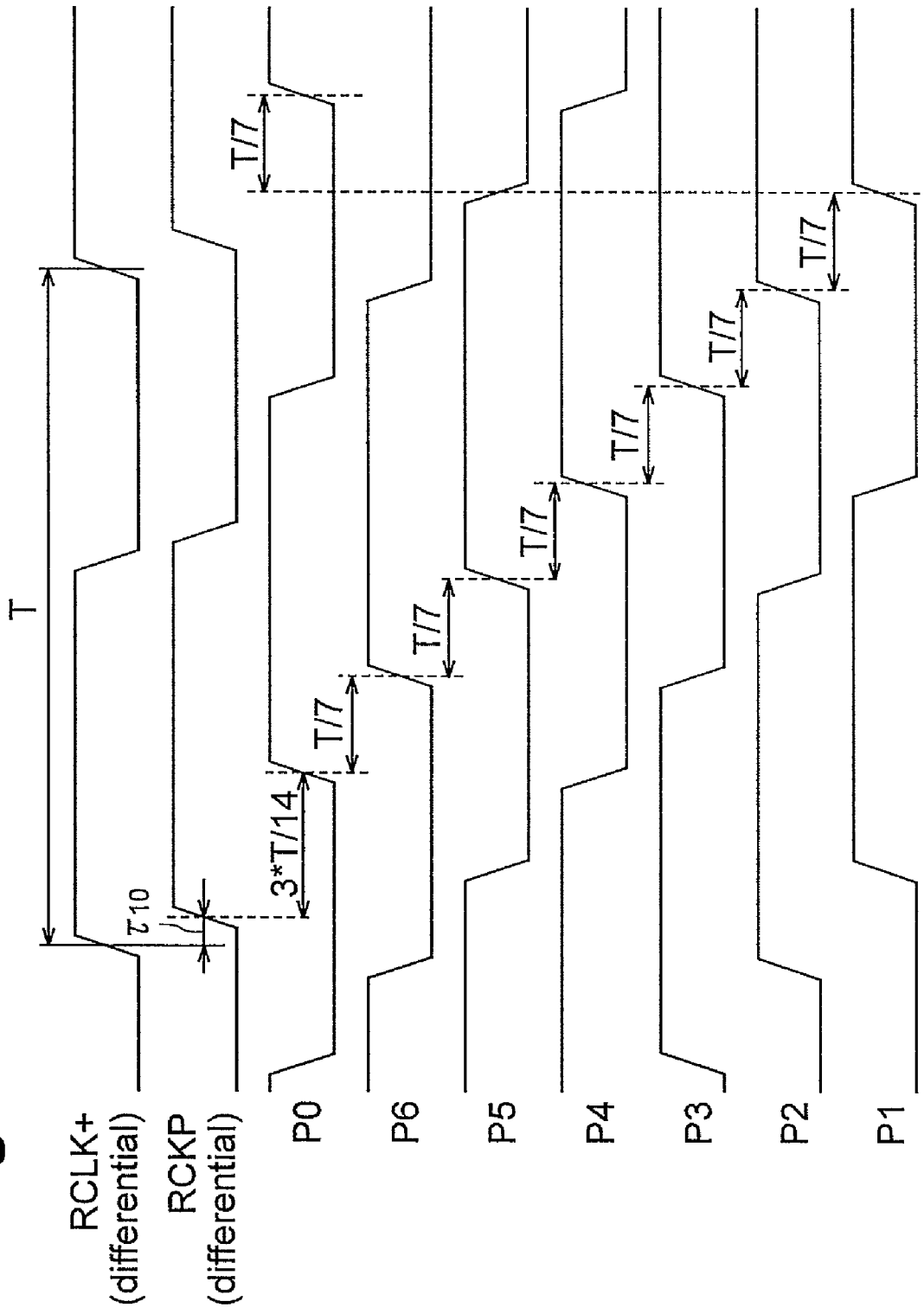
FIG. 4 is a timing chart explaining operation of the reception apparatus 9 of a comparison example.
Figure 5:
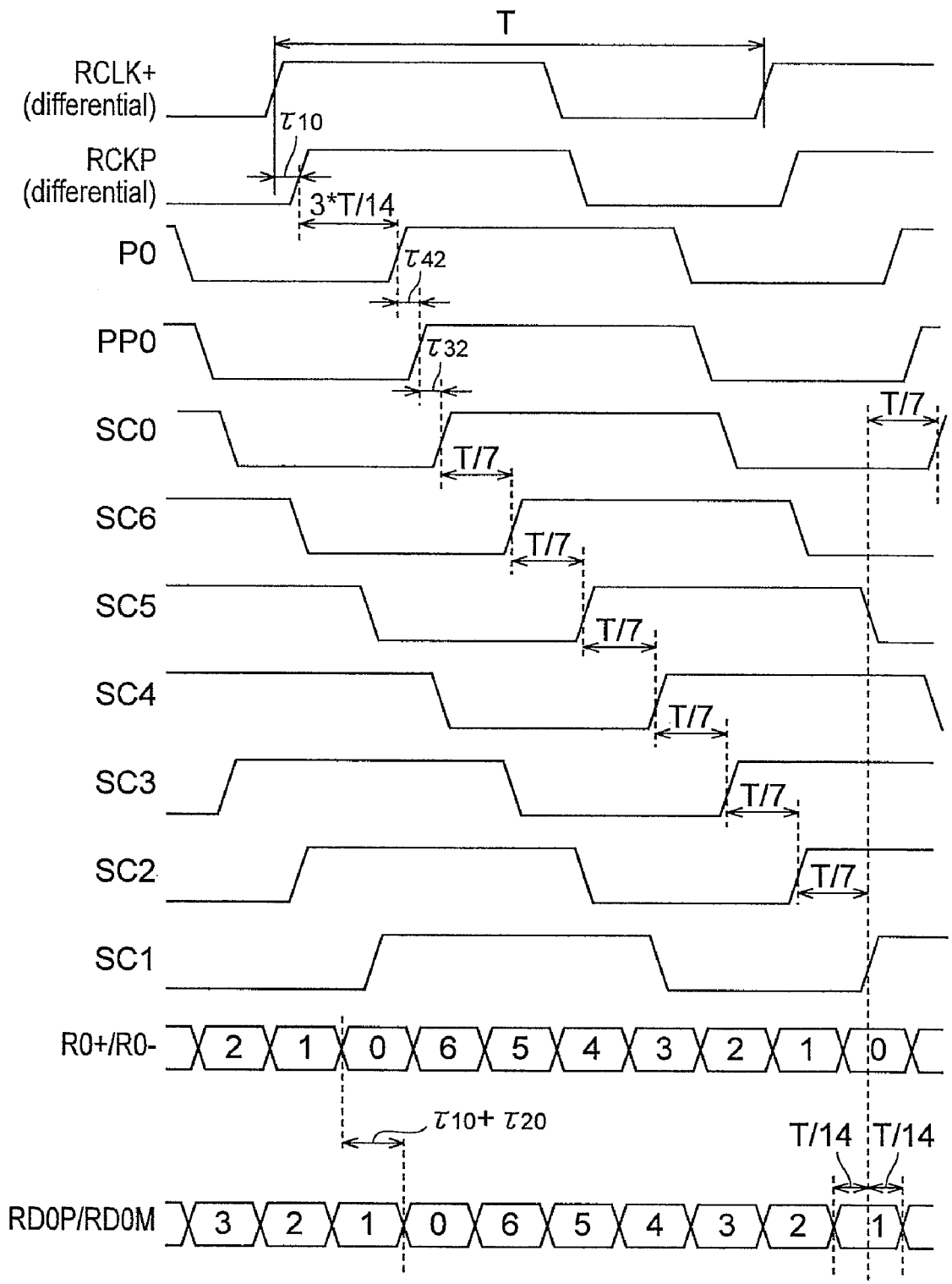
FIG. 5 is a timing chart explaining operation of the reception apparatus 9 of a comparison example.

Next, FIG. 3 to FIG. 5 are used to explain the reception apparatus of a comparison example. FIG. 3 shows the overall configuration of the reception apparatus 9 of the comparison example. And, FIG. 4 and FIG. 5 are timing charts explaining operation of the reception apparatus 9 of the comparison example.

As shown in FIG. 3, the reception apparatus 9 of the comparison example comprises a reception buffer portion 10, delay circuits $20_0$ to $20_N$, sampler block circuits $30_0$ to $30_N$, and a sampling clock signal generation circuit 40. Each of the sampler block circuits 30 comprises a sampler portion 31 and an input buffer portion 32. The sampling clock signal generation circuit 40 comprises a VCDL (Voltage Controlled Delay Line) portion 41 and an output buffer portion 42. N is a natural number, and in the following, n is an integer equal to or greater than 0 and equal to or less than N.

This reception apparatus 9 receives serial data signals and clock signals in (N+1) channels. The (N+1) delay circuits $20_0$ to $20_N$ each have equivalent circuit configurations, but there are cases in which the respective delay amounts are different.

The (N+1) sampler block circuits $30_0$ to $30_N$ each have equivalent circuit configurations, and in the following these may be represented as sampler block circuit 30. Also, of the (N+1) sampler block circuits $30_0$ to $30_N$, the internal circuit configuration is shown only for sampler block circuit $30_0$.

The reception buffer portion 10 comprises (N+2) buffers $11_0$ to $11_N$ and 12, having equivalent configurations. Each of the buffers $11_n$ takes as input the received serial data signals (differential signals) $R_{n+}/R_{n-}$, and outputs these to the delay circuit $20_g$. Each delay circuit $20_n$ takes as input the serial data signals $R'_{n+}/R_{n-}$ output from the buffer $11_n$, imparts a delay, and outputs the result, as the serial data signals $RD_{nP}/RD_{nM}$, to the sampler block circuit $30_n$.

The buffer 12 takes as input the received clock signals (differential signals) RCLK+/RCLK−, and outputs these, as the clock signals RCKP/RCKM, to the sampling clock signal generation circuit 40. The sampling clock signal generation circuit 40 takes as input the clock signals RCKP/RCKM output from the buffer 12, based on these generates multiphase sampling clock signals P0 to P6 in the VCDL portion 41, and outputs the multiphase sampling clock signals PP0 to PP6, via the output buffer portion 42, to each of the sampler block circuits $30_n$.

Each of the sampler block circuits $30_n$ takes as input the serial data signals $RD_{nP}/RD_{nM}$ output from the delay circuit $20_n$, and also takes as input the multiphase sampling clock signals PP0 to PP6 output from the sampling clock signal generation circuit 40. The sampling portion 31 comprised by each sampler block circuit $30_n$ samples the data of each bit of the serial data signals $RD_{nP}/RD_{nM}$ with the timing indicated by the respective sampling clock signals SC0 to SC6 resulting when the sampling clock signals PP0 to PP6 pass through the input buffer 32, and hold and output the sampled data.

Here, in the (N+2) buffers $11_0$ to $11_N$ and 12 comprised by the reception buffer portion 10, let the time by which the serial data signal or clock signal is delayed be $\tau_{10}$. In each of the delay circuits $20_n$, let the time by which the serial data signal is delayed be $\tau_{20}$. In the input buffer portions 32 comprised by each of the sampler block circuits $30_n$, let the time by which the multiphase sampling clock signal is delayed be $\tau 32$. And, in the output buffer portion 42 comprised by the sampling clock signal generation circuit 40, let the time by which the multiphase sampling clock signal is delayed be $\tau_{42}$.

FIG. 4 shows the timing of the clock signal RCLK+ input to the buffer 12, the clock signal RCKP output from the buffer 12, and the sampling clock signals P0 to P6 output from the VCDL portion 41. As shown in the figure, the clock signal RCKP output from the buffer 12 rises with a delay from the rise of the clock signal RCLK+ input to the buffer 12 of the delay time $\tau_{10}$ in the buffer 12. And, the sampling clock signal P0 output from the VCDL portion 41 rises with a delay from the rise of the clock signal RCKP output from the buffer 12 of time 3T/14. And, the sampling clock signals P6, P5, P4, P3, P2, P1 rise in order after the rise of the sampling clock signal P0 at time intervals of T/7.

FIG. 5 shows the timing of the clock signal RCLK+ input to the buffer 12, the clock signal RCKP output from the buffer 12, the sampling clock signal P0 output from the VCDL portion 41, the sampling clock signal PP0 output from the output buffer portion 42, the sampling clock signals SC0 to SC6 output from the input buffer portion 32, the serial data signals $R_{0+}/R_{0-}$ input to the buffer $11_0$, and the serial data signals $RD_{0P}/RD_{0M}$ output from the delay circuit $20_0$. In this figure, typical values (Typ.) for the timing specifications for LVDS reception are adopted.

As shown in FIG. 5, the sampling clock signal PP0 output from the output buffer portion 42 rises with a delay from the rise of the sampling clock signal P0 output from the VCDL portion 41 of the delay time $\tau_{42}$ in the output buffer portion 42, and the sampling clock signal SC0 output from the input buffer portion 32 rises with a delay from the rise of the sampling clock signal PP0 of the delay time $\tau_{32}$ in the input buffer portion 32. And, after the rise of this sampling clock signal SC0, the sampling clock signals SC6, SC5, SC4, SC3, SC2, SC1 rise in order at time intervals of T/7.

Further, as shown in FIG. 5, simultaneously with the rise of the clock signal RCLK+ input to the buffer 12, the data of the serial signal $R_{0+}/R_{0-}$ input to the buffer $11_0$ transitions from bit 2 to bit 1, and thereafter from bit 1 to bits 0, 6, 5, 4, 3 in order at time intervals of T/7. And, the data bits of the serial data signals $RD_{0P}/RD_{0M}$ output from the delay circuit $20_0$ transition with a delay from the transition timing of the data bits of the serial data signals $R_{0+}/R_{0-}$ equal to the sum of the delay times ($\tau_{10}+\tau_{20}$) of the buffer $11_0$ and the delay circuit $20_0$ respectively.

Here, the delay time $\tau_{20}$ in each of the delay circuits $20_0$ is set so as to be equal to the sum of the delay time $\tau_{32}$ in the input buffer portion 32 and the delay time $\tau_{42}$ in the output buffer portion 42. By this means, the sampling timings indicated by the sampling clock signals SC0 to SC6 input to the sampler portion 31 can be positioned at the centers of the data windows for each bit of the serial data signal input to the sampler portion 31.

However, in the reception apparatus 9 of the above comparison example, a delay is imparted to the serial data signals by the delay circuits $20_n$ provided in a stage before each of the sampler block circuits $30_n$, so that there is the following problem.

The level of serial data signals can change frequently compared with clock signals. It is undesirable for each of the delay circuits $20_n$ which impart delays to serial data signals with levels which change rapidly in this way to have a circuit configuration such that the transition time (rise time/fall time) required for serial data signal level changes is long. Hence it is preferable that each delay circuit $20_n$ have a multistage delay gate circuit configuration, and moreover that the number of gate stages be large. And, as the number of gate stages increases, variation in the delay time for the entire delay circuit comprising numerous delay gates becomes large.

Hence compared with the operating margin between serial data signals and clock signals at the time of reception, the operating margin between serial data signals and sampling clock signals in the sampler portion 31 is smaller. Hence it is difficult to receive high-speed serial data signals.

Further, because (N+1) delay circuits $20_0$ to $20_N$ are provided, the power consumption of the reception apparatus 9 is increased. Further, adjustment of variation in the sampling timing between channels is not easy.

Figure 6:
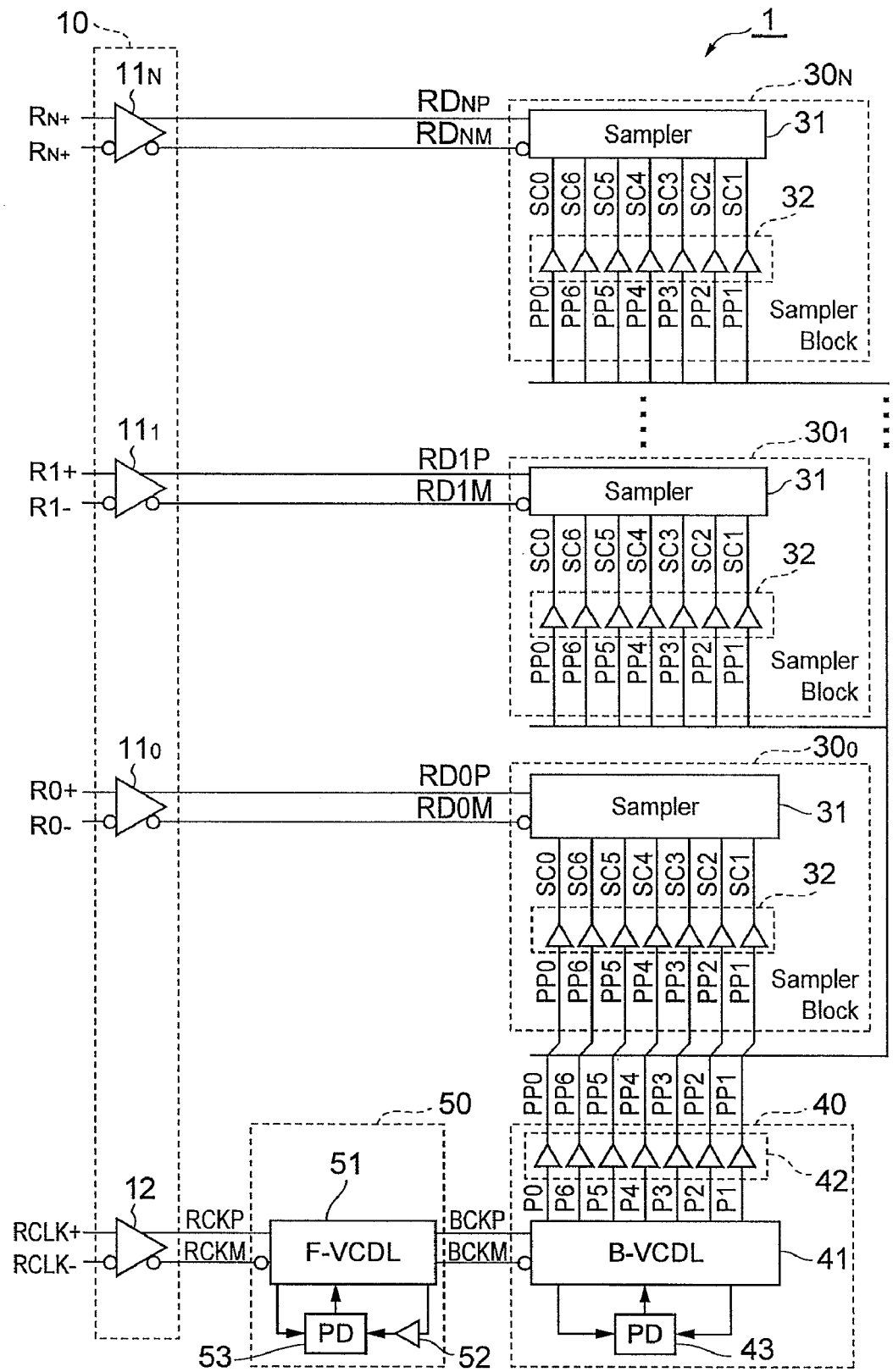
FIG. 6 shows the overall configuration of the reception apparatus 1 of a present embodiment.
Figure 7:
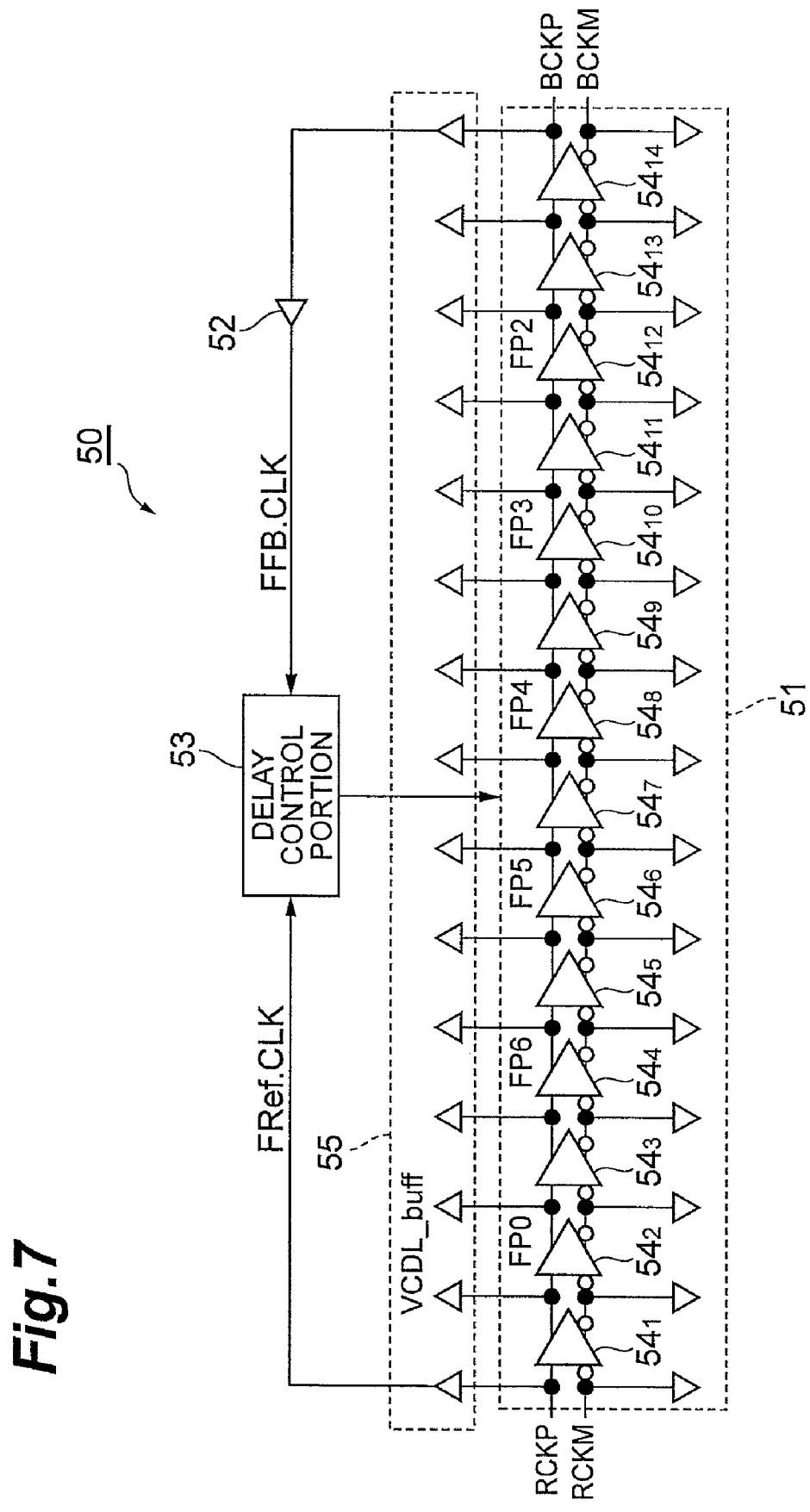
FIG. 7 is a configuration diagram of the phase adjustment circuit 50 of the reception apparatus 1 of a present embodiment.
Figure 8:
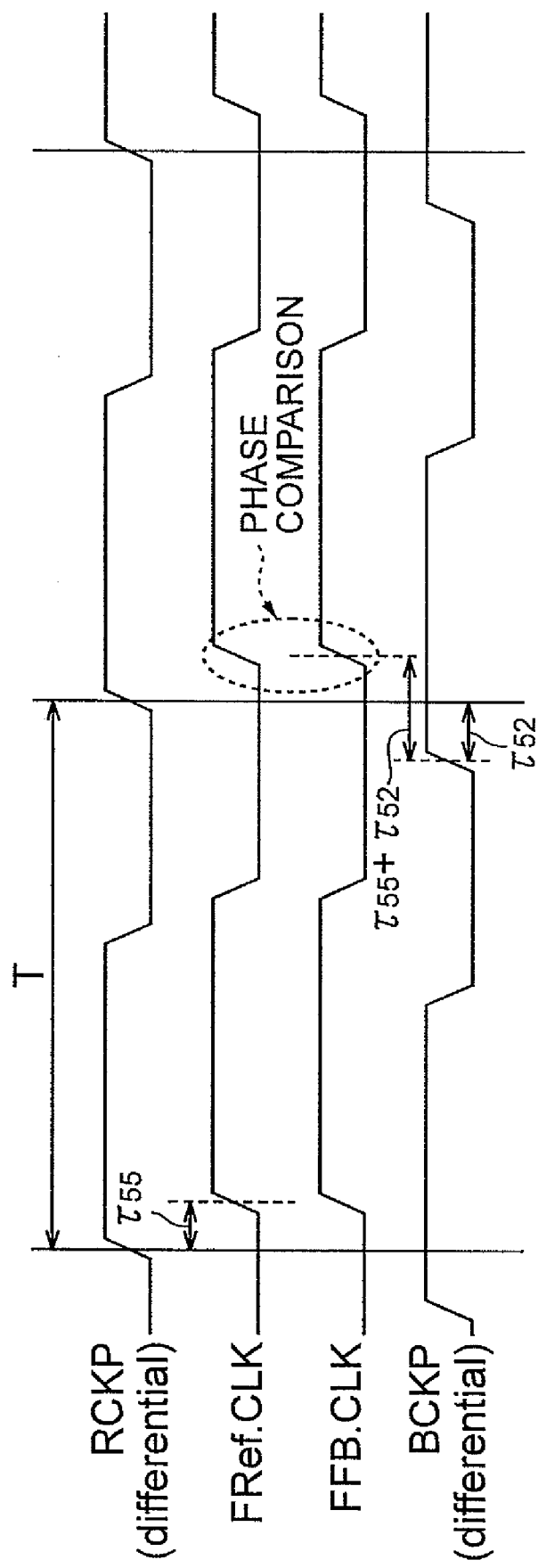
FIG. 8 is a timing chart explaining operation of the reception apparatus 1 of a present embodiment.
Figure 9:
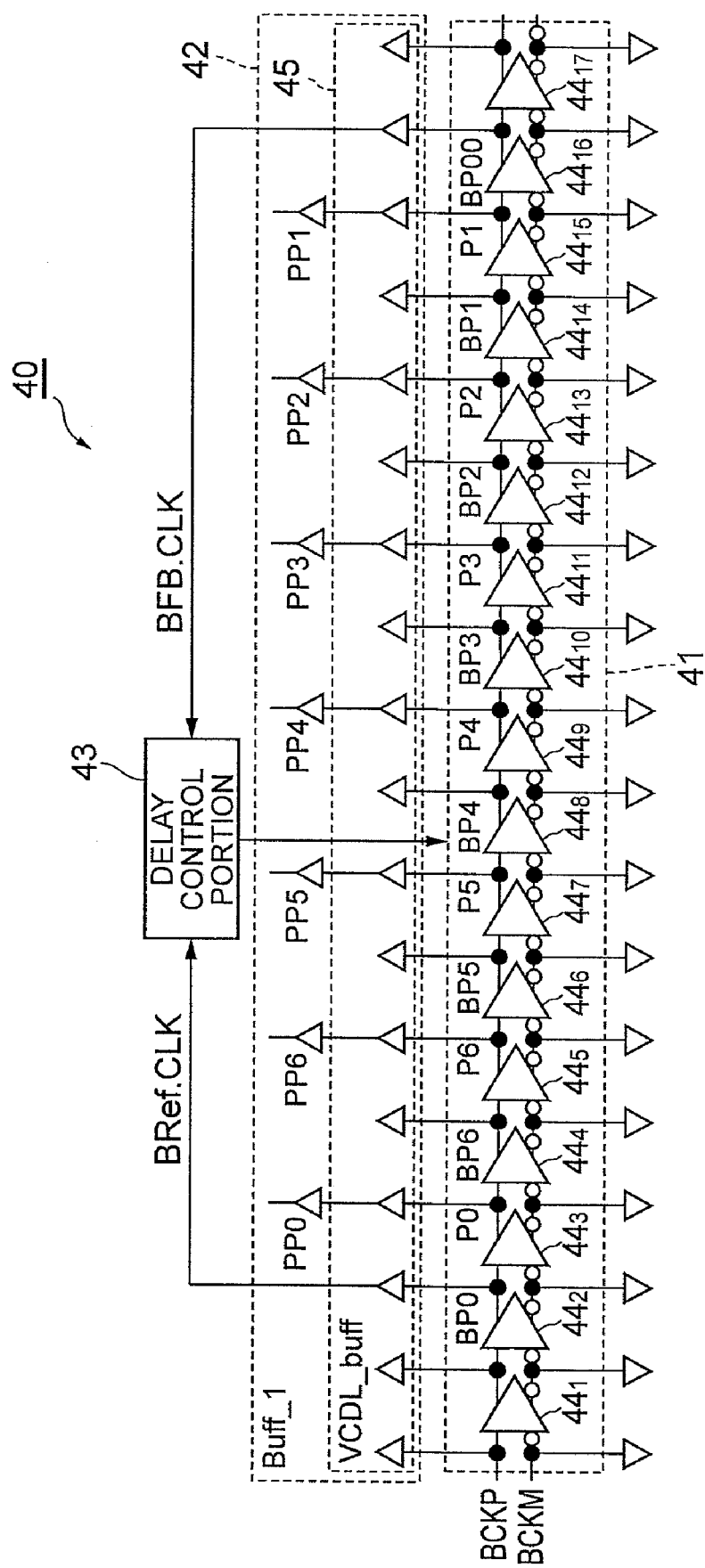
FIG. 9 is a configuration diagram of the sampling clock signal generation circuit 40 of the reception apparatus 1 of a present embodiment.
Figure 10:
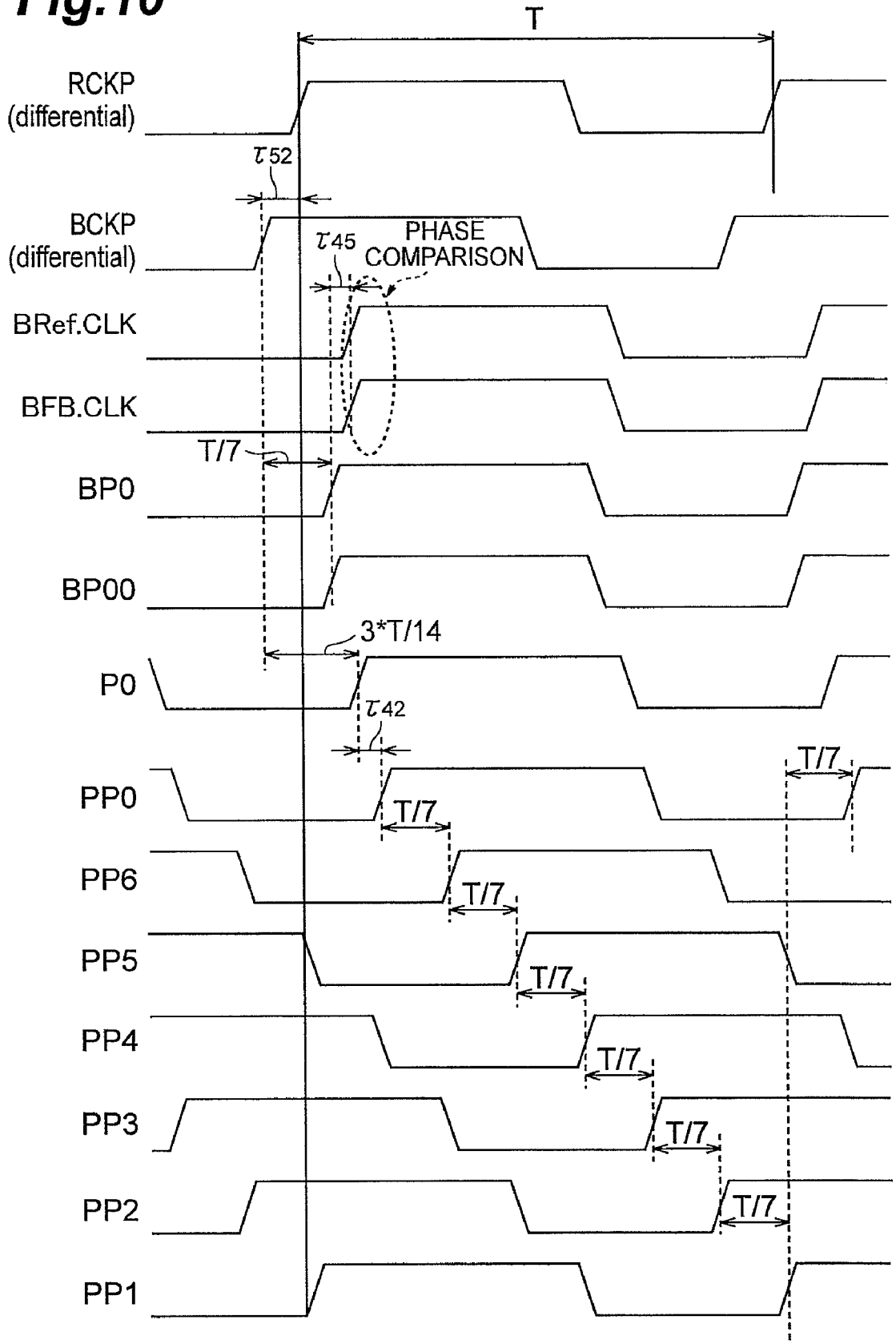
FIG. 10 is a timing chart explaining operation of the reception apparatus 1 of a present embodiment.
Figure 11:
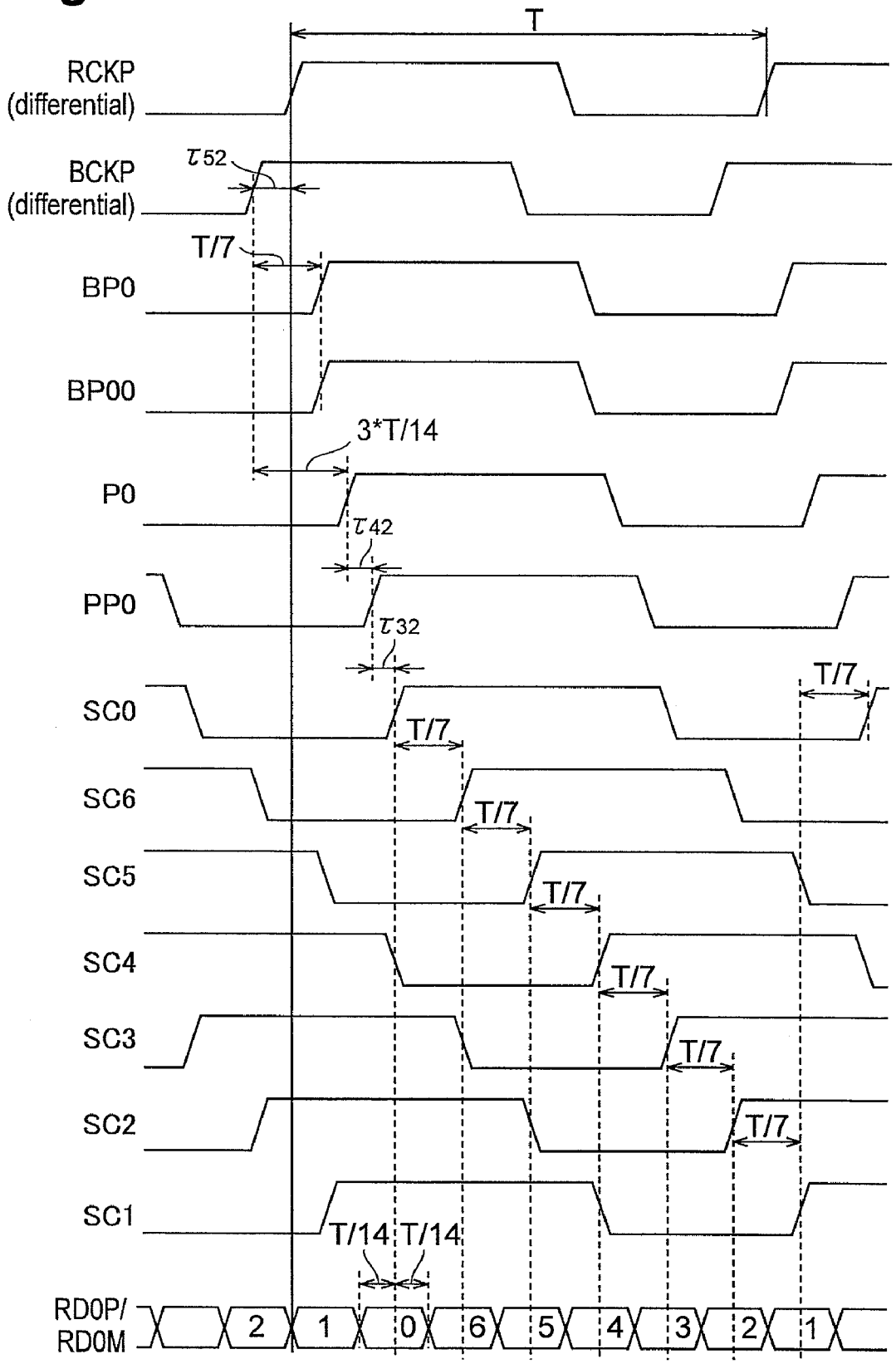
FIG. 11 is a timing chart explaining operation of the reception apparatus 1 of a present embodiment.

Next, FIG. 6 to FIG. 11 are used to explain the reception apparatus 1 of the present embodiment. The reception apparatus 1 in the present embodiment explained below resolves the problem with the reception apparatus 9 in the comparison example as explained above. FIG. 6 shows the overall configuration of the reception apparatus 1 of the present embodiment. FIG. 7 and FIG. 9 are partial configuration diagrams of the reception apparatus 1 of the present embodiment. FIG. 8, FIG. 10, and FIG. 11 are timing charts explaining operation of the reception apparatus 1 of the present embodiment.

Compared with the configuration of the reception apparatus 9 in the comparison example shown in FIG. 3, the reception apparatus 1 of the present embodiment, shown in FIG. 6, differs in further comprising a phase adjustment circuit 50; as a result, the delay circuits $20_0$ to $20_N$ are unnecessary. The phase adjustment circuit 50 takes as inputs the received clock signals RCKP/RCKM via the buffer 12, adjusts the phases of these input clock signals, and outputs the phase-adjusted clock signals BCKP/BCKM to the sampling clock signal generation circuit 40. The sampling clock signal generation circuit 40 takes as inputs the clock signals BCKP/BCKM which have been phase-adjusted and output by the phase adjustment circuit 50, and based on the input clock signals, generates multiphase sampling clock signals.

Here, the phase adjustment circuit 50 sets the adjustment amount when perform phase adjustment of the clock signals RCKP/RCKM to obtain the clock signals BCKP/BCKM, such that the delay time from generation of the multiphase sampling clock signals in the sampling clock signal generation circuit 40 until indication of sampling timing by the sampling clock signals in each of the sampler block circuits 30 is canceled.

The phase adjustment circuit 50 and sampling clock signal generation circuit 40 each have a DLL (Delay Lock Loop) configuration so as to be able to cope with cases in which the period T of the received clock signal changes. That is, the phase adjustment circuit 50 comprises a VCDL portion (first delay portion) 51, delay portion (second delay portion) 52, and delay control portion 53. And, the sampling clock signal generation circuit 40 comprises a VCDL portion 41, output buffer 42, and delay control portion 43.

As shown in FIG. 7, the VCDL portion 51 comprised by the phase adjustment circuit 50 comprises 14 VCD cells $54_1$ to $54_{14}$, cascade-connected in order, each with variable delay amounts, and takes as input the clock signals RCKP/RCKM to the initial-stage VCD cell $54_1$, and outputs clock signals BCKP/BCKM from the final-stage VCD cell $54_{14}$. In order to hold constant the loads on each of the 14 VCD cells $54_1$ to $54_{14}$, buffers are connected to the input and output terminals of each VCD cell.

The delay portion 52 takes as input the clock signal BCKP output from the final-stage VCD cell $54_{14}$, via the VCDL buffer portion 55, imparts a delay of a prescribed amount to the input clock signal, and outputs the result as the clock signal FFB.CLK. The delay control portion 53 takes as input the clock signal Fref.CLK, which results from the clock signal RCKP input to the initial-stage VCD cell $54_1$ after passing through the VCDL buffer portion 55, and also takes as input the clock signal FFB.CLK output from the delay portion 52, and controls the delay amounts in the VCDL portion 51 (that is, the delay amounts in each of the 14 VCD cells $54_1$ to $54_{14}$) such that the phases of the input clock signal Fref.CLK and the input clock signal FFB.CLK coincide.

Here, let the delay time imparted to the clock signal in the VCDL buffer portion 55 be $\tau_{55}$. Let the delay time imparted to the clock signal in the delay portion 52 be $\tau_{52}$. This delay time $\tau_{52}$ is set so as to be equal to the sum of the delay time $\tau_{32}$ in the input buffer portion 32 and the delay time $\tau_{42}$ in the output buffer portion 42.

The timing of each of the signals in the phase adjustment circuit 50 is as shown in FIG. 8. The clock signal FRef.CLK output from the VCDL buffer portion 55 is delayed relative to the clock signal RCKP input to the initial-stage VCD cell $54_1$ by the delay time $\tau_{55}$ of the VCDL buffer portion 55. The clock signal FFB.CLK output from the delay portion 52 is delayed relative to the clock signal BCKP output from the final-stage VCD cell $54_{14}$ by the sum of the delay times of the VCDL buffer portion 55 and the delay portion 52 ($\tau_{55}+\tau_{52}$). Control is executed by the delay control portion 53 such that the phases of the clock signal FRef.CLK and the clock signal FFB.CLK coincide.

In the phase adjustment circuit 50 explained here, the clock signal RCKP and the clock signal BCKP are used to adjust the phase difference between the two; but the clock signal RCKM and the clock signal BCKM may be used to adjust the phase difference between the signals.

Through this control by the delay control portion 53, the clock signals BCKP/BCKM output from the final-stage VCD cell $54_{14}$ are advanced by the time $\tau_{52}$ relative to the clock signals RCKP/RCKM input to the initial-stage VCD cell $54_1$.

The clock signals BCKP/BCKM generated by the phase adjustment circuit 50 are input to the sampling clock signal generation circuit 40.

As shown in FIG. 9, the VCDL portion 41 comprised by the sampling clock signal generation circuit 40 comprises 17 VCD cells $44_1$ to $44_{17}$, cascade-connected in order, each with variable delay amounts, and takes as input the clock signals BCKP/BCKM to the initial-stage VCD cell $44_1$. In order to hold constant the loads on each of the 17 VCD cells $44_1$ to $44_{17}$, buffers are connected to the input and output terminals of each VCD cell.

The delay control portion 43 takes as input the clock signal BrefCLK, obtained after the clock signal BP0 output from the second-stage VCD cell $44_2$ in the VCDL portion 41 has passed through the VCDL buffer portion 45, and also takes as input the clock signal BFB.CLK, obtained after the clock signal BP00 output from the 16th-stage VCD cell $44_{16}$ in the VCDL portion 41 has passed through the VCDL buffer portion 45. And, the delay control portion 43 controls the delay amounts in the VCDL portion 41 (that is, the delay amounts of each of the 17 VCD cells $44_1$ to $44_{17}$) such that the phases of the input clock signal BRef.CLK and the input clock signal BFB.CLK coincide.

The output buffer portion 42 comprises the VCDL buffer portion 45 to extract a clock signal from each VCD cell and a buffer which outputs the extracted clock signals to each of the sampler block circuits $30_n$ as sampling clock signals PP0 to PP6, and has a delay time of $\tau_{42}$.

The clock signal P0 output from the third-stage VCD cell $44_3$ passes through the output buffer portion 42 to become the sampling clock signal PP0. The clock signal P6 output from the fifth-stage VCD cell $44_5$ passes through the output buffer portion 42 to become the sampling clock signal PP6. The clock signal P5 output from the seventh-stage VCD cell $44_7$ passes through the output buffer portion 42 to become the sampling clock signal PP5. The clock signal P4 output from the ninth-stage VCD cell $44_9$ passes through the output buffer portion 42 to become the sampling clock signal PP4. The clock signal P3 output from the eleventh-stage VCD cell $44_{11}$ passes through the output buffer portion 42 to become the sampling clock signal PP3. The clock signal P2 output from the 13th-stage VCD cell $44_{13}$ passes through the output buffer portion 42 to become the sampling clock signal PP2. And, the clock signal P1 output from the 15th-stage VCD cell $44_{15}$ passes through the output buffer portion 42 to become the sampling clock signal PP1.

Here, let the delay time imparted to the clock signal in the VCDL buffer portion 45 be $\tau_{45}$. Let the delay time imparted to the clock signals in each of the 17 VCD cells $44_1$ to $44_{17}$ be $\tau_{44}$.

The timing of each of the signals in the sampling clock signal generation circuit 40 is as shown in FIG. 10. In the delay control portion 43, of the two clock signals BP0 and BP00 the phases of which are to be compared, the former clock signal BP0 passes through the 14 VCD cells $44_3$ to $44_{16}$ to become the latter clock signal BP00, and control is performed such that the phases of the two coincide. From this, the delay time $\tau_{44}$ of each of the 17 VCD cells $44_1$ to $44_{17}$ is T/14.

Hence the clock signal P0 output from the third-stage VCD cell $44_3$ is delayed by a delay time 3T/14 relative to the clock signal BCKP input to the initial-stage VCD cell $44_1$, and the sampling clock signal PP0 resulting when this clock signal P0 passes through the output buffer portion 42 is delayed by a delay time (3T/14+$\tau_{42}$). After the rise of this sampling clock signal PP0, the sampling clock signals PP6, PP5, PP4, PP3, PP2, PP1 rise in order at intervals of T/7.

The timing of each of the signals in the sampler portions 31 of each of the sampler block circuits $30_n$ is as shown in FIG. 11. The sampling clock signals PP0 to PP6 output from the sampling clock signal generation circuit 40 pass through the input buffer portion 32 and are input to the sampler portion 31 as sampling clock signals SC0 to SC6. The sampling clock signal SC0 input to the sampler portion 31 is delayed relative to the sampling clock signal PP0 output from the sampling clock signal generation circuit 40 by the delay time $\tau_{32}$ of the input buffer portion 32. Hence the sampling clock signal SC0 input to the sampler portion 31 is delayed by a delay time of $(3T/14+\tau_{42}+\tau_{32})$ relative to the clock signal BCKP input to the initial-stage VCD cell $44_1$ of the sampling clock signal generation circuit 40.

As explained above, the clock signals BCKP/BCKM output from the phase adjustment circuit 50 and input to the sampling clock signal generation circuit 40 are advanced by the delay time $\tau_{52}$ of the delay portion 52 relative to the clock signals RCKP/RCKM input to the phase adjustment circuit 50. This delay time $\tau_{52}$ is set so as to be equal to the sum of the delay time $\tau_{32}$ of the input buffer portion 32 and the delay time $\tau_{42}$ of the output buffer portion 42. That is, the relation "$\tau_{52}=\tau_{42}+\tau_{32}$" obtains.

From the above, through cancellation of the delay time $\tau_{32}$ of the input buffer portion 32 and of the delay time $\tau_{42}$ of the output buffer portion 42, the sampling clock signal SC0 input to the sampler portion 31 is delayed by the delay time 3T/14 relative to the clock signals RCKP/RCKM output from the reception buffer portion 10 and input to the phase adjustment circuit 50.

Given typical values of the timing specifications for reception in an LVDS system, at the rise of the clock signal the serial data signal transitions from data bit 2 to bit 1. Hence at the rise of the clock signal RCKP output from the reception buffer portion 10 and input to the phase adjustment circuit 50, the data of the serial data signal output from the reception buffer 10 and input to the sampler portion 31 transitions from bit 2 to bit 1.

Hence the data of the serial data signal in the LVDS system makes transitions in order at time intervals of T/7, so that the rise of the sampling clock signal SC0 which is delayed by 3T/14 from the clock signal RCKP is positioned at the center of the data window of bit 0 of the serial data signal input to the sampler portion 31. And, after the rise of this sampling clock signal SC0, the sampling clock signals SC6, SC5, SC4, SC3, SC2, SC1 rise in order, at time intervals of T/7, so that the timings of the rise of the sampling clock signals SC0 to SC6 input to the sampler portion 31 are positioned at the centers of the data windows of each of the bits of the serial data signal input to the sampler portion 31. These are the positions at which the operating margin between the serial data signals and the sampling clock signals in each of the sampler block circuits $30_n$ is maximum.

In this way, a phase adjustment circuit 50 is provided between the reception buffer portion 10 and the sampling clock signal generation portion 40, and by means of this phase adjustment circuit 50 the phase of the clock signal is advanced by the time $\tau_{52}$. And, this time $\tau_{52}$ is set so as to be equal to the sum of the delay time $\tau_{32}$ of the input buffer portion 32 and the delay time $\tau_{42}$ of the output buffer portion 42. That is, the amount of phase adjustment of the clock signal in the phase adjustment circuit 50 is such that the sum of the delay time $\tau_{32}$ of the input buffer portion 32 and the delay time $\tau_{42}$ of the output buffer portion 42 is canceled. By this means, in the present embodiment, the delay circuits $20_0$ to $20_N$ which had been necessary in the comparison example become unnecessary, and ideal sampling timing is obtained, so that high-speed serial data can easily be received.

Further, in the present embodiment the delay circuits $20_0$ to $20_N$ which had been necessary in the comparison example are unnecessary, so that there is the further advantageous result of reduced power consumption; moreover, as explained below, there is also the advantageous result that adjustment of variation in the sampling timing between channels becomes easy.

In the present embodiment, through use of sampling clock signals generated by a phase adjustment circuit 50 and sampling clock signal generation circuit 40, variation in the sampling timing between channels can easily be adjusted. That is, in an actual layout on a semiconductor substrate, wiring for sampling clock signals is provided from the sampling clock signal generation circuit 40 to each of the sampler block circuits $30_n$, so that variation in the sampling timing between channels occurs. But in the present embodiment, the sampling timing is adjusted only on the clock side, so that adjustment of variation in the sampling timing need only be performed between the input buffer portion 32 and the sampler portion 31 in each sampler block circuit $30_n$. Hence in the present embodiment, timing is adjusted only on the clock side, so that adjustment for variation is easily performed.

INDUSTRIAL APPLICABILITY

Use is possible in applications to secure an operating margin between serial data signals and sampling clock signals in a sampler block circuit.

The invention claimed is:

1. A reception apparatus, which receives a serial data signal and a clock signal, and samples and outputs data of each bit of said serial data signal based on said clock signal, comprising:
   a sampler block circuit, which takes as input said received serial data signal, also takes as input a multiphase sampling clock signal, and samples and outputs the data of each bit of said serial data signal with timing indicated by said sampling clock signal;
   a phase adjustment circuit, which takes as input said received clock signal, adjusts the phase of the input clock signal, and outputs a clock signal after this phase adjustment; and
   a sampling clock signal generation circuit, which takes as input said clock signal phase-adjusted and output by said phase adjustment circuit, and generates said multiphase sampling clock signal based on the input clock signal,
   and characterized in that
   said phase adjustment circuit adjusts the phase of said clock signal such that the delay time from generation of said multiphase sampling clock signal in said sampling clock signal generation circuit until indication of sampling timing by said sampling clock signal in said sampler block circuit is canceled.

2. The reception apparatus according to claim 1, characterized in that
   said phase adjustment circuit comprises:
   a first delay portion, which imparts a delay to an input clock signal and outputs the clock signal, and in which the delay amount is variable;
   a second delay portion, which imparts a delay of a prescribed amount to the clock signal output from said first delay portion, and outputs the clock signal; and
   a delay control portion, which takes as input the clock signal input to said first delay portion, and takes as input the clock signal output from said second delay portion, and controls the delay amount in said first delay portion such that the phases of the two input clock signals coincide.

* * * * *